United States Patent
Ge et al.

(10) Patent No.: US 8,480,996 B2
(45) Date of Patent: Jul. 9, 2013

(54) HIGH-PURITY TELLURIUM DIOXIDE SINGLE CRYSTAL AND MANUFACTURING METHOD THEREOF

(75) Inventors: Zengwei Ge, Shanghai (CN); Yong Zhu, Shanghai (CN); Guoging Wu, Shanghai (CN); Xueji Yin, Shanghai (CN); Linyao Tang, Shanghai (CN); Hanbin Zhao, Shanghai (CN); Lizhen Gu, Shanghai (CN)

(73) Assignees: Research and Development Center, Shanghai Institute of Ceramics (CN); Shanghai Institute of Ceramics, Chinese Academy of Sciences (CN)

( * ) Notice: Subject to any disclaimer, the term of this patent is extended or adjusted under 35 U.S.C. 154(b) by 0 days.

(21) Appl. No.: 13/262,209

(22) PCT Filed: Apr. 2, 2010

(86) PCT No.: PCT/CN2010/071525
§ 371 (c)(1), (2), (4) Date: Nov. 10, 2011

(87) PCT Pub. No.: WO2010/111965
PCT Pub. Date: Oct. 7, 2010

(65) Prior Publication Data
US 2012/0070366 A1    Mar. 22, 2012

(30) Foreign Application Priority Data
Apr. 3, 2009    (CN) .......................... 2009 1 0048849

(51) Int. Cl.
  *C01B 19/04* (2006.01)
  *C30B 11/02* (2006.01)
  *C30B 15/00* (2006.01)
(52) U.S. Cl.
  USPC .................. 423/509; 117/2; 117/35; 117/81

(58) Field of Classification Search
  USPC .................................. 423/509; 117/2, 35, 81
  See application file for complete search history.

(56) References Cited

FOREIGN PATENT DOCUMENTS

| | | |
|---|---|---|
| CN | 85107803 | 4/1987 |
| CN | 1487126 | 4/2004 |
| JP | 57-135794 | 8/1982 |
| JP | 61-174199 A * | 8/1986 |

OTHER PUBLICATIONS

Chu, Yaoqing et al. 'Growth of the high quality and large size paratellurite single crystals' Journal of Crystal Growth, 2006, vol. 295, pp. 158-161.

Shintaro, Miyazawa et al. 'Single crystal growth of paratellurite TeO2' Japanese Journal of Applied Physics, 1970, vol. 9(5), pp. 441-445.

* cited by examiner

*Primary Examiner* — Timothy Vanoy
(74) *Attorney, Agent, or Firm* — Bozicevic, Field & Francis LLP; Bret E. Field

(57) ABSTRACT

A high-purity tellurium dioxide ($TeO_2$) single crystal and its manufacturing method are provided. The method comprises the following procedures: firstly performing a first single crystal growth, and then dissolving the resulting single crystal again, thereafter adding a precipitation agent to form powder, and finally performing a second single crystal growth of as-prepared powder to obtain the high purity single crystal. The $TeO_2$ single crystal prepared according to present invention is of high purity, especially with a content of radioactive impurities such as U and Th decreased to a level of $10^{-13}$ g/g.

19 Claims, 1 Drawing Sheet

HIGH-PURITY TELLURIUM DIOXIDE SINGLE CRYSTAL AND MANUFACTURING METHOD THEREOF

TECHNICAL FIELD

The present invention relates to a high-purity tellurium dioxide (TeO$_2$) single crystal and its manufacturing method, which belongs to the technical field of single crystal growth.

BACKGROUND

In the field of nuclear physics, the experiments of neutrino have drawn world wide attention in science frontline. In 1956, Clyde Cowan and Frederick Reines directly detected the neutrino in experiment and they were awarded the 1995 Nobel Prize in physics; in 1962, Leon M. Lederman, Melvin Schwartz and Jack Steinberger discovered a second type of neutrino, i.e. muon neutrino and they thus wined the 1988 Nobel Prize in physics; Raymond Davis Jr. and Masatoshi Koshiba were jointly awarded the 2002 Nobel Prize in Physics, in which Davis for his pioneer work on cosmic neutrinos in 1968 and Koshiba for the first real time observation of supernova neutrinos in 1987. However, till now the questions about neutrino mass scale and the transformation between different types of neutrinos are still basic scientific issues need to be answered in nuclear physics (Zhixun Huang, Engineering Science, 2002, 4(10), 7-10).

In the research field of neutrino, the decay rate (half life) of double beta decay is an important issue because the relationship between decay rate (half life) and absolute mass of neutrino can be expressed as following:

$$\tau_{1/2}^{-1} = G^{thr}(Q,Z)|M^{Gr}|^2|\langle m_v\rangle|^2$$

So, the absolute mass of neutrino can be known through the half life detection of double beta decay. Till now, double beta decay experiments seem to be still the only way to detect the absolute mass of neutrino (R. Ardito et al., Annual Report for CUORICINO and CUORE 2004, 17-37).

Tellurium dioxide (TeO$_2$) single crystal is an excellent acousto-optic (AO) material, which can be used in various kinds of AO devices, such as AO deflectors, AO modulators, AO resonators and tunable filters (S. Kumaragurubaran et al., J. Crystal Growth 2000, 211, 276-280; P. Veber et al., J. Crystal Growth 2004, 270, 77-84).

Besides, TeO$_2$ single crystal has double beta decay property, which can be used in nuclear physics as double beta decay source (I. Dafenei et al., Nucl. Instrum. Meth. A 2005, 554, 195-200). As the natural abundance of $^{130}$Te is high (34%, the highest level of all natural double beta decay source), TeO$_2$ single crystal can be used as double beta decay source without enrichment process, thus the cost is much lower.

However, if TeO$_2$ single crystal is used as double beta decay source for the detection of neutrino mass, the crystal itself should be of high purity, especially with a content of some radioactive impurities such as U and Th deceased to a level of 10$^{-13}$ g/g.

Chinese patent ZL03141999.2 reported the Bridgman growth of TeO$_2$ single crystal with large size and good quality, through which the radioactive impurities such as U and Th decreased to a level of 10$^{-12}$ g/g, but still couldn't reach the level required for double beta decay source.

Until now (filing date of the present invention), we haven't found any reports about decreasing impurities to prepare high pure TeO$_2$ single crystal.

SUMMARY OF THE INVENTION

The first aim of the present invention is to provide a manufacturing method for high-purity TeO$_2$ single crystal. The method involves a double growth technique, i.e. through double impurities repellence processes, purifying the crystal and accelerating the decay process of radioactive elements, thus further decrease the radioactive impurities, and finally get high-purity TeO$_2$ single crystal.

The manufacturing method for high-purity TeO$_2$ single crystal provided by the present invention has characteristics as following:

(1) filling crucible with TeO$_2$ powder to carry out the first single crystal growing process;
   wherein the TeO$_2$ powder is commercial or self-made;
   wherein the preparation methods for TeO$_2$ powder are commonly used methods in this field, including but not restricted to one of the methods from dissolving-neutralization method, chlorination-neutralization method, tellurite decomposition method or direct oxidation method;
   wherein the crystal growth method includes Bridgman method and Czochralski method;

(2) dissolving the single crystal prepared in step (1) with acid solution;
   wherein the acid solution could be hydrochloric acid or the mixed acid of hydrochloric acid with other acid, in which other acid preferably inorganic acid, further preferably sulfuric acid or nitric acid, and the mixed volume ratio for hydrochloric acid and other acid could be 1:0.01-10;
   wherein the concentration of acid solution is 0.05-50 wt %;
   wherein the acid solution is preferably hydrochloric acid, and the preferable concentration is 0.05-40 wt %, further preferable concentration is 0.1-38 wt %;
   before the process of dissolving, it is preferably to remove the outer skin of the single crystal obtained in step (1), and the preferable thickness of removed outer skin is 0.05-5 mm, further preferable thickness is 1-2 mm;

(3) adding basic precipitator to the solution of step (2), followed by the filtering and drying process to obtain TeO$_2$ powder;
   wherein the basic precipitator could be ammonia or urea, and if the basic precipitator is mixed solution of ammonia and urea, then the mixed ratio could be random;
   wherein the basic precipitator is preferably ammonia, and the preferable concentration is 0.05-35 wt %, further preferable concentration is 0.1-30 wt %;

(4) filling crucible with the TeO$_2$ powder obtained in step (3) (TeO$_2$ (II)) to carry out the second single crystal growing process;
   wherein the crystal growth method includes Bridgman method and Czochralski method;
   the technical conditions for Bridgman method or Czochralski method are commonly used conditions in this field.

The second aim of the present invention is to provide a high-purity TeO$_2$ single crystal, in which the concentration of U is lower than 9.9×10$^{-13}$ g/g, the concentration of Th is lower than 9.9×10$^{-13}$ g/g, and the concentration of U is preferably lower than 9.9×10$^{-14}$ g/g.

The high-purity TeO$_2$ single crystal could be used as high quality AO crystal for AO devices, especially AO deflectors, AO modulators, AO resonators, tunable filters and so on.

The advantages of manufacturing method for high-purity TeO$_2$ single crystal provided by the present invention are as following:

(1) the single crystal growing process itself could repel impurities, therefore dissolving the single crystal obtained from the first crystal growth and then precipitating it into powder, this method could obtain purified powder with several times purer;

(2) the double growth technique includes two repellence processes, which could not only purify the single crystal, but also accelerate the decay process of radioactive elements, thus further decrease the radioactive impurities to more than ten times lower, and finally obtain high-purity $TeO_2$ single crystal.

DETAILED DESCRIPTION OF THE INVENTION

Figure 1:
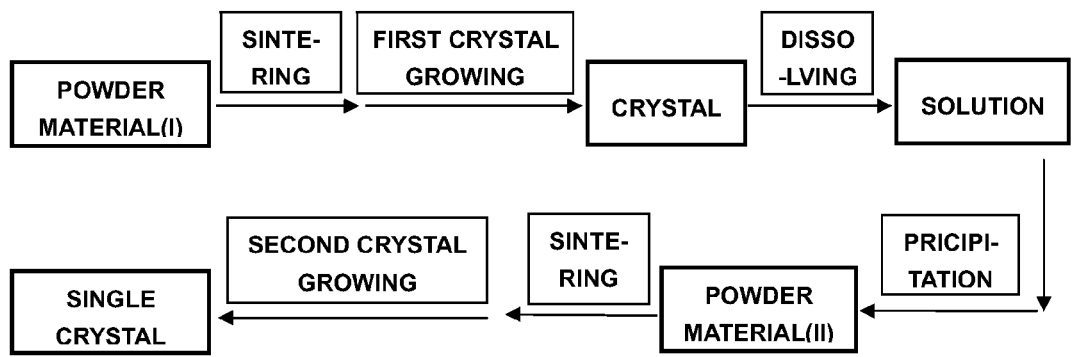
FIG. 1 shows schematic drawings of the manufacturing method for the high-purity $TeO_2$ single crystal according to the present invention.

For illustrative purpose, representative embodiments of this invention are described hereafter. It will be understood that the embodiments are used only for illustrating, not for restricting the scope of this invention. As for the experiment without the description of detailed conditions, it should follow the regular conditions or recommended conditions from manufactory.

Unless other definition or explanation provided, all the professional and scientific language used in the invention has the same meaning familiar with the technicians in this field. Besides, any similar or same method or material can be applied in this invention.

Example 1

(1) The $TeO_2$ powder prepared with dissolving-neutralization method (marked as $TeO_2$ powder (I)) was calcinated at 680° C. in platinum crucibles for 12 h and then rapidly cooled to room temperature. After that, the calcinated powder and oriented $TeO_2$ seed were filled into a platinum crucible, sealed and then heated to 750° C. and kept at this temperature for 10 hours. The growing process was then driven by lowering the crucible at a rate of 1.0 mm per hour and rising the furnace temperature at a rate of about 2° C. per hour. At the end of the growing process the crucible was cooled down to room temperature at a rate of 30° C. per hour. The whole processes for the first growth were finished after the annealing process at 680° C. for 12 h.

(2) 1-2 mm thickness of outer skin of the crystal obtained in step (1) was removed by rough mechanical method, and then the remained $TeO_2$ crystalline pieces were dissolved with 37.5 wt % hydrochloric acid, forming $TeCl_4$ solution.

(3) 28 wt % concentrated ammonia was then added into the $TeCl_4$ solution prepared in step (2), and the obtained white precipitate was further washed and dried, and finally even purer $TeO_2$ powder (marked as $TeO_2$ powder (II)) was obtained.

(4) The pure powder obtained in step (3) was further filled into a platinum crucible and a second growth process was executed following the same procedure as in the step (1).

ICP-MS test was conducted for the purity test of $TeO_2$ powders before and after the first growth, i.e. the purity of $TeO_2$ powder (I) and $TeO_2$ powder (II) (seen Table 1).

TABLE 1

| ICP-MS test results of $TeO_2$ powder (unit: g/g) | | | | |
|---|---|---|---|---|
| | Material | | | |
| | U | Th | Bi | Pb |
| $TeO_2$ powder (I) | $1.0 \times 10^{-9}$ | $4.0 \times 10^{-9}$ | $3.7 \times 10^{-8}$ | $2.2 \times 10^{-7}$ |
| $TeO_2$ powder (II) | $<2.0 \times 10^{-10}$ | $<2.0 \times 10^{-10}$ | $2.2 \times 10^{-8}$ | $<1.0 \times 10^{-7}$ |

From Table 1, we can see that the $TeO_2$ powder (I) used for the first crystal growth had radioactive impurities like U and Th at a level of $10^{-9}$ g/g, other impurities like Pb $2.2 \times 10^{-7}$ g/g. However, through one crystal growing process and the following dissolving-neutralization process with high pure hydrochloric acid and ammonia respectively, the obtained $TeO_2$ powder (II) had much higher purity. The concentration of radioactive impurities like U and Th were lower than $2.0 \times 10^{-10}$ g/g, and other impurities like Pb was lower than $10^{-7}$ g/g. From the above analysis, it is clear that after a crystal growth process, impurities were repelled to some extent, thus the obtained single crystal had higher purity.

Figure 2:
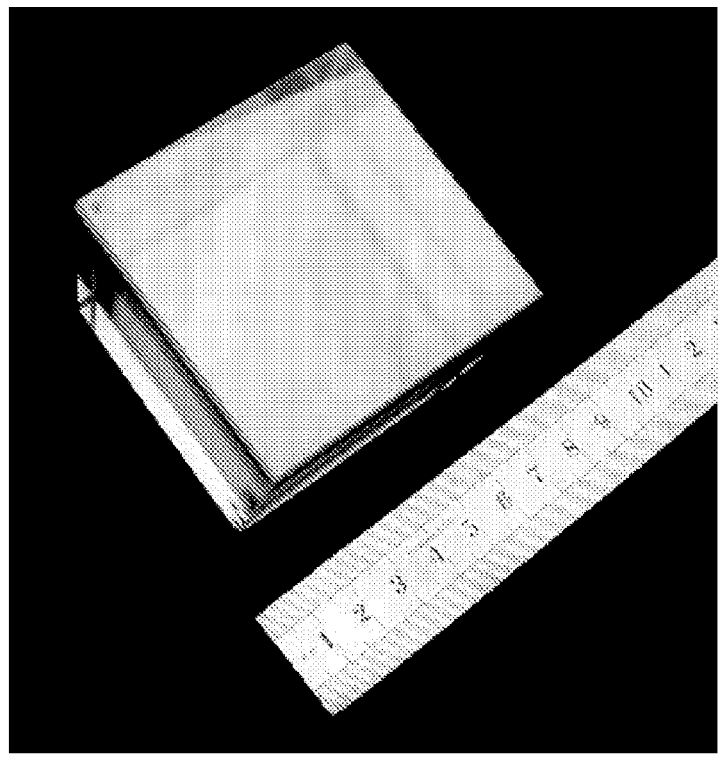
FIG. 2 shows the photo of high-purity $TeO_2$ single crystal from Example 1 of the present invention.

Another phenomenon is that radioactive impurities (like U and Th) seem to be removed more obviously than other impurities (like Bi and Pb). The explanation could be that during the crystal growth process, not only the impurities were purified, but also the decay process of radioactive elements was accelerated. Therefore, using the purer $TeO_2$ powder (II) to start the second crystal growth, through the double growth technique i.e. two repellence processes, we can further decrease the radioactive impurities, and finally obtain high-purity $TeO_2$ single crystal (see FIG. 2).

Using radioactive array detector, we know that the obtained high-purity $TeO_2$ single crystal had a content of radioactive impurities of U at a level of $8.2 \times 10^{-14}$ g/g and Th $1.1 \times 10^{-13}$ g/g, which can fulfill the demand for neutrino detection in nuclear physics.

Example 2~3

The material selection and detailed parameters in example 2~3 are listed in Table 2 (other parameters are the same as example 1).

Example 4

(1) The commercial $TeO_2$ powder was filled into a platinum crucible, and then Oxygen gas was guided into at a rate of 750 ml per minute. When the powder was melted, kept at the temperature for 4 hours. And then lowered the oriented seed gradually. Tuning the surface temperature of the melt and let the seed contacted the liquid surface near the balance of solid and liquid. After seeding process, pulling at a rate of 1.2 mm per hour and rotating the seed at a rate of 30 r/m. At the end of the growing process the crucible was cooled down to room temperature at a rate of 60° C. per hour. The whole processes for the first growth were finished after the annealing process at 680° C. for 12 h.

(2) 0.5-0.8 mm thickness of outer skin of the crystal obtained in step (1) was removed by rough mechanical method, and then the remained $TeO_2$ crystalline pieces were dissolved with 37.5 wt % hydrochloric acid, forming $TeCl_4$ solution.

(3) 28 wt % concentrated ammonia was then added into the $TeCl_4$ solution prepared in step (2), and the obtained white precipitate was further washed and dried, and finally even purer $TeO_2$ powder (marked as $TeO_2$ powder (II)) was obtained.

(4) the pure powder obtained in step (3) was further filled into a platinum crucible and a second growth process was executed following the same procedure as in the step (1).

Example 5~8

The material selection and detailed parameters in example 5~8 are listed in Table 2 (other parameters could be known from the Bridgman method in example 1 and the Czochralski method in example 4).

TABLE 2

| Example | First Crystal Growth Growth method | Dissolving Solvent and its concentration | Precipitation Precipitator and its concentration | Second Crystal Growth Growth method |
|---|---|---|---|---|
| Example 1 | Bridgman method | 37.5 wt % HCl | 28 wt % NH$_4$OH | Bridgman method |
| Example 2 | Bridgman method | 15 wt % HCl | 10 wt % NH$_4$OH | Bridgman method |
| Example 3 | Bridgman method | 37.5 wt % HCl | 30 wt % NH$_4$OH | Bridgman method |
| Example 4 | Czochralski method | 37.5 wt % HCl | 28 wt % NH$_4$OH | Bridgman method |
| Example 5 | Bridgman method | 15 wt % HCl | 20 wt % NH$_4$OH | Czochralski method |
| Example 6 | Czochralski method | 37.5 wt % HCl | 15 wt % NH$_4$OH | Czochralski method |
| Example 7 | Czochralski method | 49.5 wt % HCl and 15 wt % H$_2$SO$_4$, Vol % = 10:1 | 15 wt % NH$_4$OH | Czochralski method |
| Example 8 | Czochralski method | 5 wt % HCl and 40 wt % H$_2$SO$_4$, Vol % = 1:10 | 5 wt % NH$_4$OH and 20 wt % Urea, Vol % = 1:2 | Czochralski method |

The invention claimed is:

1. A manufacturing method for high-purity TeO$_2$ single crystal, comprising:
   (1) Filling a crucible with TeO$_2$ powder to carry out a first single crystal growing process and preparing a single crystal;
   (2) Dissolving the single crystal prepared in step (1) with acid solution;
   (3) Adding basic precipitator to the solution of step (2), followed by a filtering and drying process to obtain TeO$_2$ powder;
   (4) Filling a crucible with the TeO$_2$ powder obtained in step (3) to carry out a second single crystal growing process and growing a high-purity TeO$_2$ single crystal.

2. The method of claim 1, wherein the acid solution is hydrochloric acid or the mixed acid of hydrochloric acid with other acid.

3. The method of claim 1, wherein the acid solution is hydrochloric acid.

4. The method of claim 1, wherein the concentration of the acid solution is 0.05~50 wt %.

5. The method of claim 4, wherein the concentration of the acid solution is 0.05~40 wt %.

6. The method of claim 2, wherein the other acid is inorganic acid.

7. The method of claim 6, wherein the other acid is sulfuric acid or nitric acid.

8. The method of claim 7, wherein the mixed volume ratio for hydrochloric acid and other acid is 1:0.01~10.

9. The method of claim 1, wherein the basic precipitator is ammonia or urea.

10. The method of claim 9, wherein the basic precipitator is ammonia.

11. The method of claim 9, wherein the concentration for basic precipitator is 0.05-35 wt %.

12. The method of claim 9, wherein the mixed ratio for ammonia and urea is random.

13. The method of claim 1, wherein the crystal growth method includes Bridgman method and Czochralski method.

14. The method of claim 1, wherein the TeO$_2$ powder is commercial or self-made, wherein the self-made methods include one of the methods from dissolving-neutralization method, chlorination-neutralization method, tellurite decomposition method or direct oxidation method.

15. The method of claim 1, wherein the preferable thickness of removed outer skin is 0.05-5 mm.

16. A high-purity TeO$_2$ single crystal, wherein the concentration of U is lower than $9.9 \times 10^{-13}$ g/g, Th is lower than $9.9 \times 10^{-13}$ g/g.

17. A high-purity TeO$_2$ single crystal, wherein the concentration of U is lower than $9.9 \times 10^{-14}$ g/g.

18. The high-purity TeO$_2$ single crystal of claim 16, wherein the crystal is used in acousto-optic devices.

19. The high-purity TeO$_2$ single crystal of claim 18, wherein the crystal is used in AO deflectors, AO modulators, AO resonators, or tunable filters.

* * * * *